(12) United States Patent
Van Bilsen

(10) Patent No.: US 6,703,592 B2
(45) Date of Patent: Mar. 9, 2004

(54) SYSTEM OF CONTROLLING THE TEMPERATURE OF A PROCESSING CHAMBER

(75) Inventor: Frank B. M. Van Bilsen, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 10/309,383

(22) Filed: Dec. 2, 2002

(65) Prior Publication Data

US 2003/0080112 A1 May 1, 2003

Related U.S. Application Data

(63) Continuation of application No. 09/739,863, filed on Dec. 18, 2000, now Pat. No. 6,507,007, which is a continuation of application No. 09/495,765, filed on Feb. 1, 2000, now Pat. No. 6,191,399.

(51) Int. Cl.[7] .................................................. H05B 1/02
(52) U.S. Cl. .................. 219/497; 219/497; 219/501; 219/505; 219/494; 219/486; 392/416; 392/418; 374/1; 374/102; 374/103; 118/724; 118/725
(58) Field of Search ................................ 219/497, 501, 219/505, 494, 486; 392/416, 418; 374/1, 102, 103; 118/724, 725

(56) References Cited

U.S. PATENT DOCUMENTS

| | | |
|---|---|---|
| 3,796,009 A | 3/1974 | Shimotsuma et al. |
| 3,969,943 A | 7/1976 | Ohno et al. |
| 4,435,092 A | 3/1984 | Iuchi |
| 4,854,727 A | 8/1989 | Pecot et al. |
| 4,890,245 A | 12/1989 | Yomoto et al. |
| 4,913,790 A | 4/1990 | Narita et al. |
| 4,919,542 A | 4/1990 | Nulman et al. |
| 4,969,748 A | 11/1990 | Crowley et al. |
| 4,984,902 A | 1/1991 | Crowley et al. |
| 5,098,198 A | 3/1992 | Nulman et al. |
| 5,156,461 A | 10/1992 | Moslehi et al. |
| 5,225,245 A | 7/1993 | Ohta et al. |
| 5,377,126 A | 12/1994 | Flik et al. |
| 5,549,756 A | 8/1996 | Sorensen et al. |
| 5,707,146 A | 1/1998 | Gaus et al. |
| 5,743,644 A | 4/1998 | Kobayashi et al. |
| 5,802,099 A | 9/1998 | Curran et al. |
| 5,830,277 A | 11/1998 | Johnsgard et al. |
| 5,875,416 A | 2/1999 | Kanno |
| 6,080,969 A | 6/2000 | Goto et al. |
| 6,207,936 B1 | 3/2001 | De Waard et al. |

*Primary Examiner*—Mark Paschall
(74) *Attorney, Agent, or Firm*—Knobbe, Martens, Olson & Bear, LLP

(57) ABSTRACT

A CVD processing reactor employs a pyrometer to control temperature ramping. The pyrometer is calibrated between wafer processing by using a thermocouple that senses temperature during a steady state portion of a processing operation.

31 Claims, 5 Drawing Sheets

SYSTEM OF CONTROLLING THE TEMPERATURE OF A PROCESSING CHAMBER

REFERENCE TO RELATED APPLICATION

This application is a continuation of U.S. application Ser. No. 09/739,863, filed Dec. 18, 2000, now U.S. Pat. No. 6,507,007 which is a continuation of U.S. application Ser. No. 09/495,765, filed Feb. 1, 2000, now U.S. Pat. No. 6,191,399, issued Feb. 20, 2001.

FIELD OF THE INVENTION

The present invention relates to processing substrates in processing chambers, such as a semiconductor processing reactor, and particularly to a method of increasing throughput for process steps at controlled temperatures.

BACKGROUND OF THE INVENTION

High-temperature ovens, called reactors, are used to create fine dimension structures, such as integrated circuits, on semiconductor substrates. Several substrates, such as silicon wafers, are placed on a wafer support inside the reactor. Both wafer and support are heated to a desired temperature. In a typical wafer treatment step, reactant gases are passed over the heated wafer, causing the chemical vapor deposition (CVD) of a thin layer of the reactant material on the wafer. A series of such treatment steps on a single wafer is called a recipe. If the deposited layer has the same crystallographic structure as the underlying silicon wafer, it is called an epitaxial layer. This is also sometimes called a monocrystalline layer because it has only one crystal structure. Through subsequent deposition, doping, lithography, etch and other processes, these layers are made into integrated circuits, producing from tens to thousands or even millions of integrated devices, depending on the wafer size and the circuits' complexity.

Various process parameters are carefully controlled to ensure the high quality of the resulting layers. One such critical parameter is the wafer temperature during each recipe step. During CVD, for example, the deposition gases react within particular temperature windows and deposit on the wafer. Different temperatures also result in different deposition rates. Accordingly, it is important to accurately control the wafer temperature to bring the wafer to the desired temperature before the treatment begins.

One factor which critically affects the throughput of a CVD processing reactor is the wafer temperature ramp rate. Such temperature ramping can be required at several points during a given recipe. For example, a cold wafer must be heated to the appropriate treatment temperature. Also, the recipe may require different temperatures for different treatment steps. At the recipe's end, the wafer ordinarily is cooled to a level that the wafer handling device can tolerate. The heating and cooling steps can represent a significant percentage of the processing time and can limit the reactor's throughput. The time between the steady state temperatures is essentially time which should be minimized so as to increase the reactor's throughput.

The rate at which the wafer temperature can change from one steady state to another depends on the reactor's ramp rate. The reactor's ramp rate depends on the temperature controller type, temperature sensor, energy source, and other process considerations. A thermocouple is a device for measuring temperature in which a pair of wires of dissimilar metals (e.g., copper and iron) is joined and the wire's free ends are connected to an instrument (e.g., a voltmeter) that measures the difference in potential that is created at the junction of the two metals. When thermocouples are used to measure the wafer temperature, the thermocouple's thermal mass limits the response time to temperature changes. Thus, during a ramp, the thermocouple measurement significantly lags the wafer temperature. Reactors employing thermocouples are typically operated at ramp rates slower than the heating mechanisms can handle to limit the temperature difference between the wafer and thermocouple. If the ramp rate is too high, such that by the time the thermocouple temperature catches up to the wafer temperature the wafer has been at a significantly higher temperature, the temperature controller reacts after the wafer temperature overshoots the target temperatures.

An optical pyrometer determines the wafer temperature by measuring the amount of light emitted by the wafer. The pyrometer reacts to temperature changes faster than the thermocouple and therefore does not significantly lag the wafer temperature. Therefore, a pyrometer can be used as a temperature controller sensor element to rapidly respond to changes in wafer temperature. Rapid response time allows for higher ramp rates without overshooting the target temperature, which can minimize the overhead time between steady state temperatures. The increase in ramp rate can significantly increase the reactor's throughput.

While optical pyrometers demonstrate response time advantages over thermocouples, pyrometers are less accurate in calibration readings. Among other problems, wafer emissivity changes at different temperatures, and with different structures at the surface, such that accurate calibration over a temperature range, and at different stages of integrated circuit processing, is challenging and is difficult to achieve with accuracy. Moreover, pyrometer instrumentation itself tends to alter readings over time, all other things being equal.

Both emissivity differences and drift call for initial and periodic calibration of the pyrometer with more accurate temperature measuring devices such as thermocouples. Typically, an instrumented or sacrificial sample wafer is utilized for this purpose. Not only is the instrumented wafer itself expensive, but down time required for calibration cycles translates to reactor down time and lower wafer throughput, leading to higher production cost.

U.S. Pat. No. 4,854,727 (the '727 patent) discloses an exemplary method for calibrating the emissivity characteristics of a semiconductor wafer temperature measurement element. The '727 patent discloses comparing the temperature measured within a susceptor in close proximity to the center of the wafer with the temperature measured by a radiation pyrometer by using a sample wafer, prior to the processing of a batch of similar wafers. The temperature measurements for the wafers in the batch are corrected with reference to the measurements taken by using the sample wafer.

Accordingly, a need exists for an apparatus and method for controlling wafer temperatures that avoids the slow response time of thermocouples and the inaccuracy and calibration down time associated with optical pyrometers.

SUMMARY OF THE INVENTION

A CVD reactor temperature controller employs non-contact sensors such as pyrometers, to increase the throughput of the reactor. Sensors such as thermocouples, which rely on heating an element, are used in conjunction with the pyrometers to adjust the pyrometers for drift effects. The pyrometer reading is adjusted by comparing the pyrometer measurement to the thermocouple measurement during a steady state portion of the recipe. Changes in the difference between the two measurements indicate a change in the drift effect. The controller compensates for the drift effect when receiving readings from the pyrometer. The pyrometer measurements are adjusted when the wafer is removed from the reactor to prevent any abrupt changes in the temperature measurement before a recipe is complete. Hence, the adjustment does not cause any down time.

The present invention allows for accurately measuring the wafer temperature throughout the process. It employs the advantages of pyrometers without being burdened by its major disadvantages. The use of pyrometers enables recipes with high ramp rates, thereby improving the reactor throughput without degrading processing quality.

DETAILED DESCRIPTION OF THE PREFERRED EMBODIMENT

Exemplary System

Figure 1:
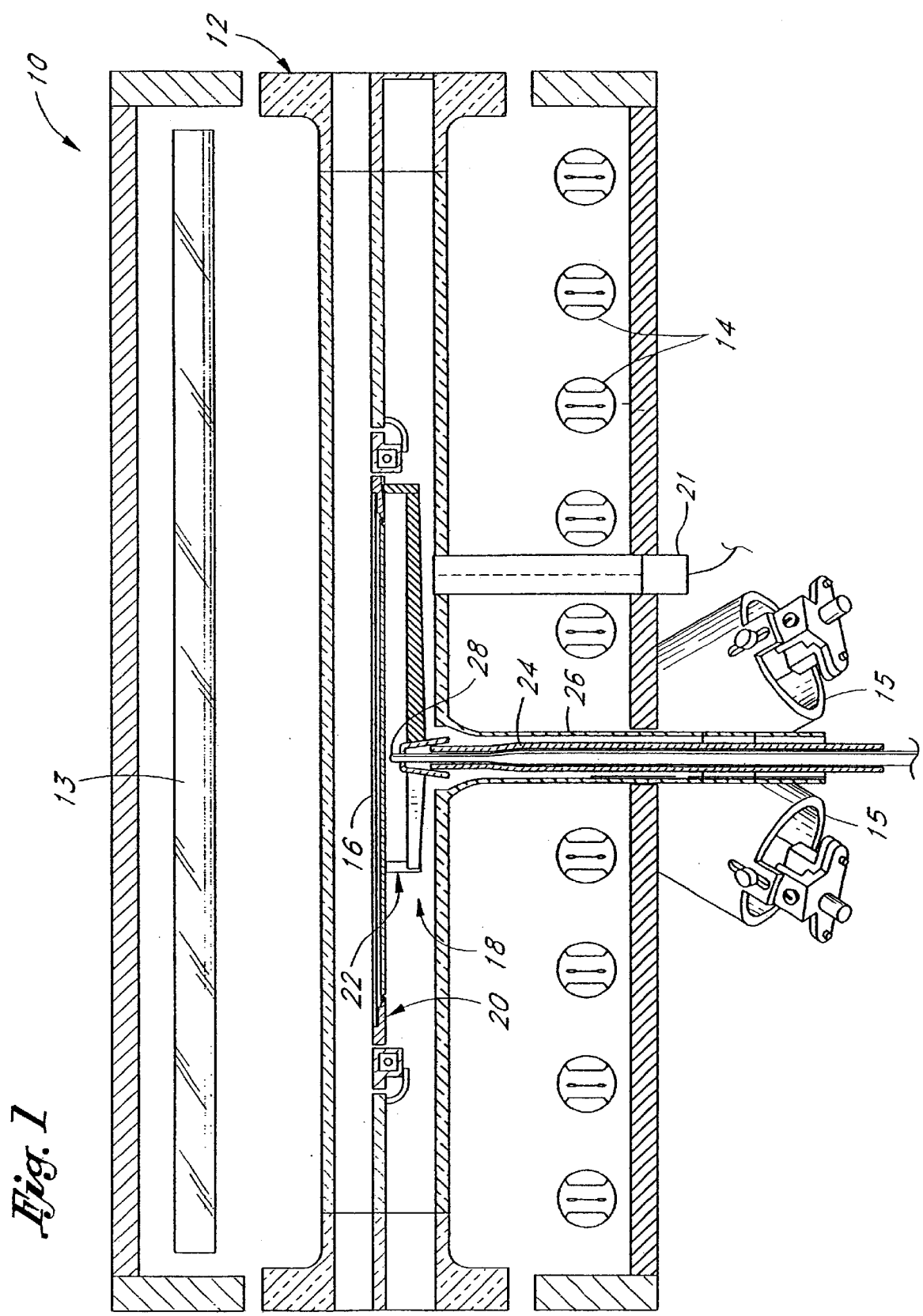
FIG. 1 is a schematic sectional view of an exemplary reaction chamber.

FIG. 1 illustrates an exemplary CVD reactor 10, including a quartz reaction chamber 12. A plurality of radiant heat sources are supported outside the chamber 12, to provide heat energy to the chamber 12 without appreciable absorption by the quartz chamber walls. While the preferred embodiments are described in the context of a "cold wall" CVD reactor for processing semiconductor wafers, the processing methods described herein have utility in the context of other reactor types. In particular, one of skill in the art can find application for the methods described herein for other processing equipment, wherein a semiconductor substrate is to be treated at a controlled temperature. Further, one can implement the present invention in conjunction with other heating/cooling systems, such as those employing inductive or resistive heating. Moreover, precise temperature control is often required in other substrate treatments, including, without limitation, the deposition of optical thin films on glass or other substrates.

The illustrated radiant heat sources comprise an upper heating assembly of elongated tube-type radiant heating elements 13. The upper heating elements are preferably disposed in spaced parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Additionally, a plurality of spot lamps 15 supply concentrated heat to the underside of the wafer support structure to counteract a heat sink effect created by cold support structures extending through the bottom of the reaction chamber 12.

Desirably, a portion of the radiant heat is diffusely reflected into the chamber 12 by rough specular reflector plates above and below the upper and lower lamps 13, 14, respectively. In some arrangements, the heating assemblies may include curved focusing reflectors to focus the radiant energy from heating elements. For example, energy from peripheral heating elements in an upper heating chamber may be focused downward on a temperature compensation ring, to compensate for peripheral heat losses at wafer edges, while central heating elements diffusely heat the wafer. U.S. Pat. No. 4,975,561, issued to Robinson, discloses such radiant heat focusing elements. Other reflectors can be disposed outside the reaction chamber 12.

Each of the elongated tube type heating elements 13, 14 is preferably a high intensity tungsten filament lamp having a transparent-quartz envelope containing a halogen gas, such as iodine. Such lamps produce full-spectrum radiant heat energy that is transmitted through the walls of the reaction chamber 12 without appreciable absorption. As is known in the art of semiconductor processing equipment, the power of the various lamps 13, 14, 15 can be controlled independently or in grouped zones in response to temperature sensors, as is described in more detail with respect to the temperature control system.

In the illustrated reactor 10, the upper heating assembly includes nine upper heating elements 13 of about 6 kW maximum power. The lower heating assembly includes eight lower heating lamps 14 of about 6 kW maximum power, as well as four spot lamps 15 of about 1 kW maximum power. Accordingly, the maximum power of the illustrated single wafer processing reactor 10 is about 106 kW. It will be understood that other reactors may have greater or lesser power capacity. In particular, batch processors generally have a much greater capacity for heating the mass of a number of wafers simultaneously.

A wafer 16 is shown supported within the reaction chamber 12 upon a wafer support structure 18. The illustrated support structure 18 includes a wafer holder 20 upon which the wafer 16 rests, and a support spider 22. The spider 22 is mounted to a shaft 24, which extends downwardly through a tube 26 depending from the chamber 12 lower wall.

A non-contact temperature sensor 21 such as a pyrometer is supported in proximity with the reaction chamber 12 to monitor the temperature of a wafer 16 that is positioned inside the chamber 12 on the wafer support structure 18. The pyrometer 21 is coupled to a temperature controller (FIG. 2) that controls the operation of the chamber heating elements 13, 14, 15. A thermocouple 28 is positioned inside the tube 26 that depends from the chamber 12 lower wall.

Figure 2:
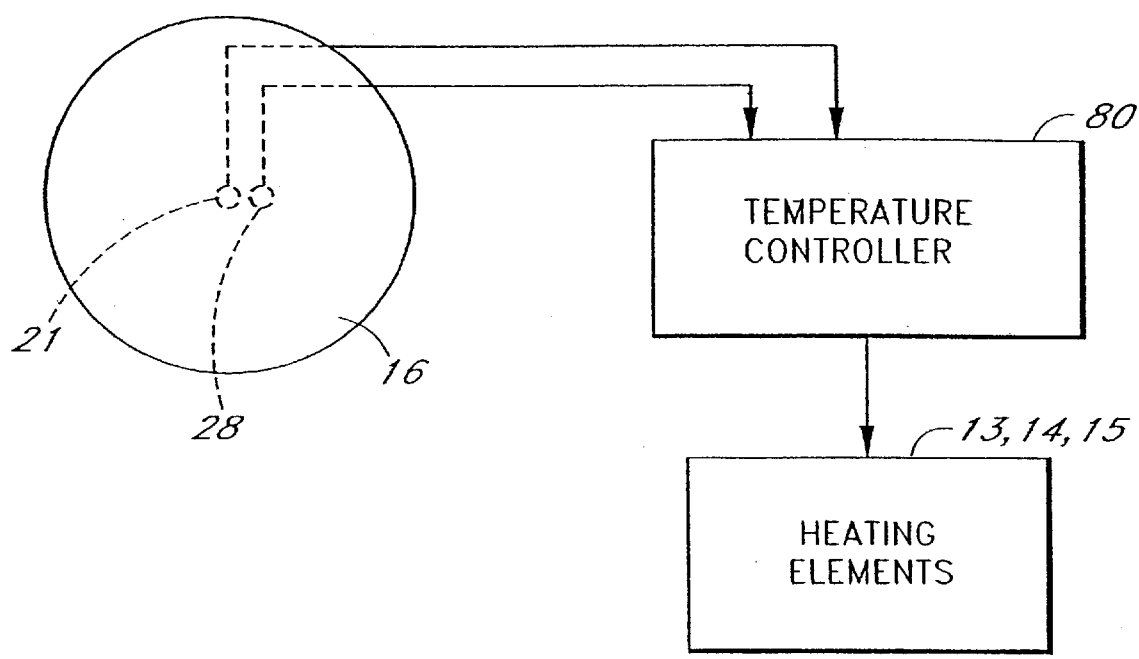
FIG. 2 is a schematic plan view of the wafer in relation to temperature sensors and a temperature controller.

FIG. 2 illustrates the arrangement of the temperature controller 80, the pyrometer 21, the thermocouple 28, and the heating elements 13, 14, 15. The temperature controller 80 is preferably a circuit that is configured to control the temperature of the reactor 10 in accordance with instructions from an operator or from a main control unit. The temperature controller 80 is responsive to temperature readings from the pyrometer 21. In an alternative embodiment, the temperature controller 80 is responsive to readings from the pyrometer 21 during a first portion of a recipe, and is responsive to readings from the thermocouple 28 during a second portion of the recipe. The thermocouple 28 readings are used by the temperature controller 80 to periodically calibrate the pyrometer 21 as discussed below.

The temperature controller 80 employs the readings from the pyrometer 21 to estimate the temperature of the wafer 16. In response to readings from the pyrometer 21, the temperature controller adjusts the heating elements 13, 14, 15, so as to provide a desired wafer temperature. During upward ramping (i.e., from a lower to a higher temperature), the temperature controller 80 reduces the power of the heating elements 13, 14, 15, when the temperature reading from the pyrometer exceeds the desired ramp peak value.

Ideal Wafer Temperature

To ready the wafer for a recipe step, the technician chooses a "setpoint" (i.e., the temperature-time curve that the wafer 16 is ideally to follow). The setpoint generally includes a flat plateau at a stable temperature at which processing is to be conducted. Such a plateau is referred to herein as a "setpoint treatment temperature." Computer software or the technician selects parameters for the temperature controller to adjust the slope of the temperature curves to critically tune the system for efficiently reaching the desired treatment temperature. For example, the settings may include a first temperature, a second temperature, and a duration for remaining in the second temperature. A PID controller is well known in the art as being used to control the temperature according to the setpoint by setting the P, I, and D variables of the temperature controller. The temperature controller controls the heating elements by using the pyrometer reading to reduce the temperature gradient between the setpoint and the measurement.

Figure 3A:
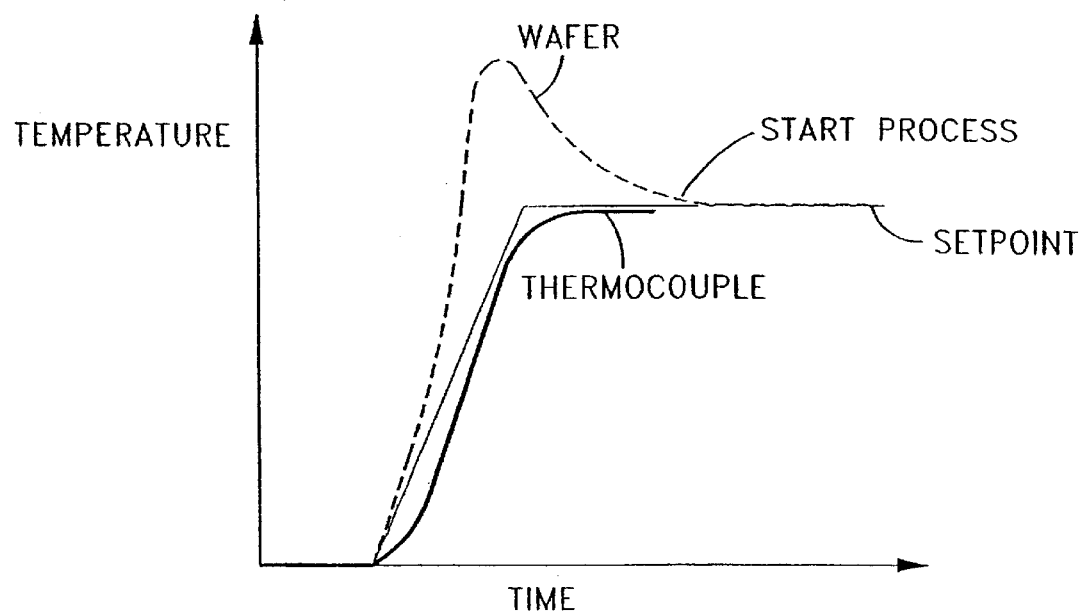
FIG. 3A is a model plot of a temperature ramp in which a thermocouple is used as the temperature sensor of the temperature controller.

Referring to FIG. 3A, an exemplary temperature ramp and treatment is illustrated which employs a thermocouple as the temperature controller's temperature sensor. The setpoint, wafer, and thermocouple temperature-time curves are shown. As can be appreciated, the wafer temperature significantly deviates from the setpoint due to the lag in thermocouple readings. The wafer temperature significantly exceeds the thermocouple reading when the thermocouple temperature reaches the plateau temperature. The wafer 16 reaches a stable temperature at or near the setpoint significantly before the thermocouple reaches a stable, parallel temperature. To ensure that the wafer temperature is at the desired level for the treatment, the start time for the treatment is typically delayed from the time the thermocouple temperature reached the desired level so as to allow the wafer temperature to reach the same stable temperature.

Figure 3B:
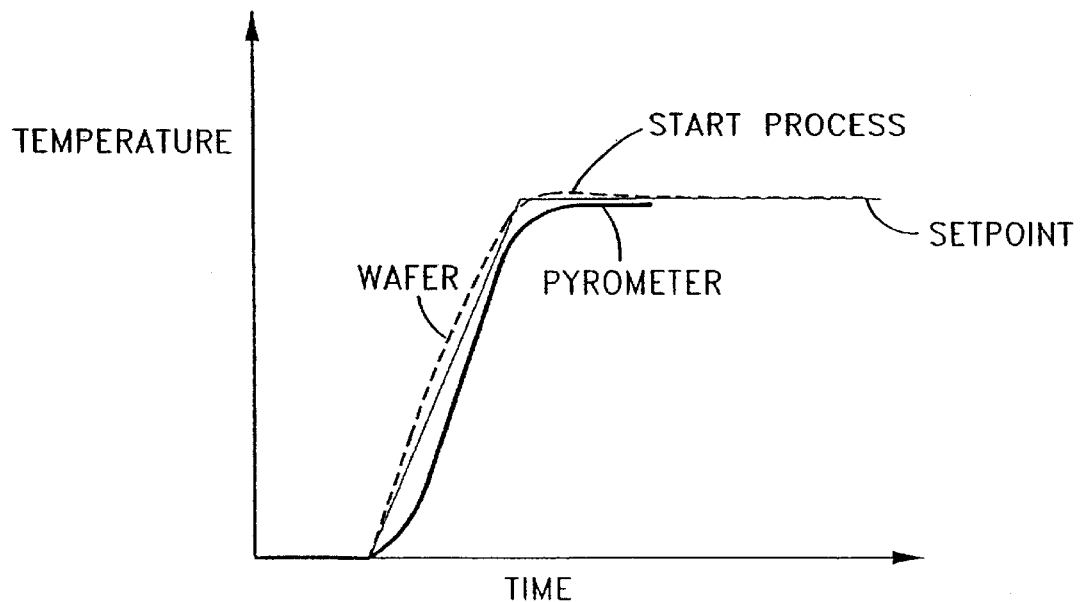
FIG. 3B is a model plot of a temperature ramp in which a pyrometer is used as the temperature sensor of the temperature controller.

FIG. 3B illustrates an exemplary temperature ramp and treatment when a pyrometer is employed as the temperature controller's sensor. The setpoint, wafer, and pyrometer temperature-time curves are shown. The wafer temperature closely follows the setpoint as a result of the elimination of lag between the pyrometer reading and the wafer temperature. The wafer temperature reaches a steady level at the treatment temperature almost with the setpoint. Therefore, the treatment start time is substantially expedited. As can be appreciated from FIG. 3B, the use of a pyrometer as the temperature controller's sensor significantly shortens time needed to ramp the wafer temperature to the desired treatment level. Thus, an increase in throughput results from the use of the pyrometer.

In temperature control systems, a thermocouple is sometimes referred to as a contact type sensor because it frequently is placed in contact with the article where temperature is to be sensed. However, it is sometimes positioned slightly spaced from that article. A thermocouple, of course, senses temperature by thermal transfer with respect to the article to be measured. A sensor of this type shall be referred to in this document as a contact-type sensor, but that term as used herein is intended to cover thermocouples that are positioned close to but not actually contacting the article to be sensed. Further "contact-type sensor" is intended to cover a temperature sensor that operates by heat transfer even though it is not a thermocouple.

By contrast, a pyrometer is often referred to as a non-contact-type sensor since it is normally considerably spaced from the article being sensed and measures radiation emitted by the wafer. For purposes of this document, a non-contact-type sensor is intended to include not only a pyrometer but other sensors that can sense temperature remotely.

Although FIGS. 3A, 3B reflect real data it will be understood that the graph represents the general relationship among the setpoint, wafer, thermocouple, and pyrometer curves, regardless of the size (temperature difference) or direction (heating or cooling) of the ramp.

The term "treatment," in the meaning of the present application, refers to any step or set of steps which is to be conducted at a stable, controlled temperature. It will be understood by one of skill in the art that the terms "stable," "controlled," or "steady state," in reference to temperature level, are treatment dependent and can often refer to a range of temperatures. For example, an epitaxial deposition treatment can take place satisfactorily within about 3–4° C. of the target temperature. Polysilicon deposition, on the other hand, should be stable within about 1° C. Implant activation can be satisfactorily performed within 20–50° C. or even greater deviations from the target temperature. One of skill in the art of semiconductor processing can determine for each given treatment the required degree of temperature stability.

The treatment at a stable temperature is to be contrasted with the term "recipe," which as used herein includes the entire setpoint and associated procedures, from loading a wafer or batch of wafers into a reactor chamber until unloading the wafer or batch. While the general case will be discussed in terms of a hypothetical CVD treatment, it will be understood that a treatment may be a step in any of a number of different recipes for which step a stable controlled temperature is required. For example, the treatment can simply consist of an anneal in the original inert environment (e.g., $H_2$ gas), in which case the wafer 16 should be stable at the desired temperature for a predetermined time period. In such a case, the beginning of the treatment is not defined by the introduction of reactant gases, but is rather defined merely by the point at which a technician begins timing the pre-determined period for the anneal.

The data of FIGS. 3A and 3B was obtained using an instrumented wafer (not shown), constructed in any suitable manner, for directly measuring the wafer temperature during the ramp, while the thermocouple and pyrometer temperatures were, of course, directly measured. Instrumented wafers are known, in general, and have been used in the past for various calibration steps at lower temperatures. For example, temperature offsets for input into controllers can be obtained by directly measuring the temperature difference between the wafer 16 and the various thermocouples 28–31 at a low temperature steady state.

Such instrumented wafers, however, cannot be used at temperatures above about 1050° C. Furthermore, they obviously cannot be used during actual production, when integrated circuits or other structures are created on the substrate. During processing, the controller only knows the setpoint and the temperatures of the thermocouples. The actual wafer temperature is not directly measured during processing.

Accordingly, the end of a temperature ramp has conventionally been defined by the point at which one or more of the remote temperature sensors (e.g., thermocouples) indicate that their readings have stabilized. Either the reactor control computer or a technician monitored the thermocouples until they reached a stable temperature. At that point, the desired treatment could begin.

Drift Effect Compensation

The pyrometer reading compensation is accomplished by comparing the measurement from the thermocouple 28 to the measurement from the pyrometer 21. The temperature reading should be taken from the same area of the reactor 10 and at substantially the same time. Readings of different areas may not provide reliable information as to the performance of an instrument. Readings from different times may also not provide reliable information for comparison. The temperature reading of a thermocouple generally lags behind the temperature of the object it monitors because thermocouples have a thermal mass that requires a steady state before providing an accurate measurement. When the temperature of the thermocouple 28 is constantly changing, it is difficult to determine the time when the measurement was an accurate reflection of the object's temperature. Therefore, the thermocouple temperature can usually only serve as a reliable indicator of the surrounding temperature when the temperature of the object does not change for a period of time. The temperature of the wafer 16 does not change during a steady state portion of the recipe. During steady state portion of the recipe, the thermocouple 28 reading is generally an accurate reflection of the wafer temperature. Further, the thermocouple temperature is a more reliable temperature indicator than that of a pyrometer 21 because the thermocouple 28 does not suffer from the effects of either drift or emissivity variations. Employing the more reliable measurement, the temperature controller 80 can determine the amount of drift suffered by the pyrometer 21 by comparing the pyrometer measurement to the thermocouple measurement.

There is always some difference between the steady state thermocouple measurement and the pyrometer measurement because the two sensors employ different mechanisms to measure temperature. When the difference between the two measurements changes, the one measurement that is likely to have changed is the pyrometer reading which is affected by drift. Thus, by comparing a current difference in readings to a previous difference in readings, the amount of drift can be estimated. The temperature controller adjusts the readings from the pyrometer 21 by a factor derived from the amount of change in difference between the two readings. The adjustment of the pyrometer reading is not immediate because an immediate change may lead to a jump in wafer temperature that is undesirable. Instead, the adjustment is made between the processing of individual wafers. Because drift is a cumulative effect that becomes significant generally only after processing a number of wafers, an adjustment between processing individual wafers does not detract from the effectiveness of the drift adjustment.

Figure 4:
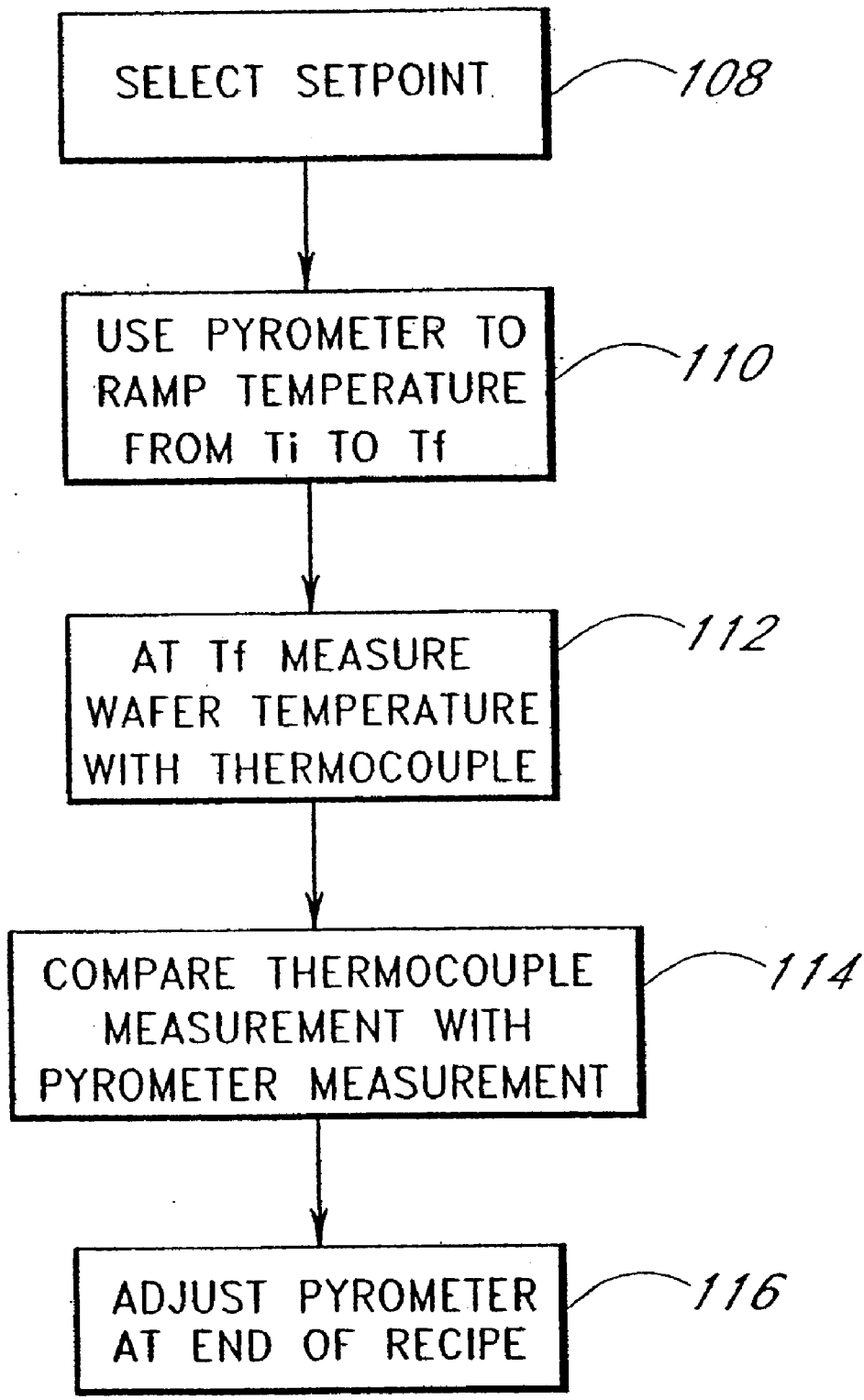
FIG. 4 is a flow chart showing generally the steps for calibrating a pyrometer in accordance with the preferred method.

FIG. 4 illustrates the process taken by the temperature controller 80 to control the temperature of the reactor 10 and adjust the pyrometer 21 for drift. The controller 80 starts by selecting a setpoint (step 108) as discussed above. The pyrometer 21 is used as the sensor of the temperature controller 80 to control the setpoint ramping (step 110). Once the reactor temperature is at the desired level for a period of time generally required in the prior art to allow the thermocouple to catch up to the wafer temperature, the controller 80 reads the thermocouple temperature (step 112). The controller 80 then compares the pyrometer measurement to the thermocouple measurement (step 114). If the difference between the two measurements has changed, the controller adjusts the weight assigned to the pyrometer readings when controlling the reactor temperature. The adjustment to pyrometer reading is made after the current recipe is completed (step 116) so as to prevent sudden changes in reactor temperature, as was discussed above.

Figure 5:
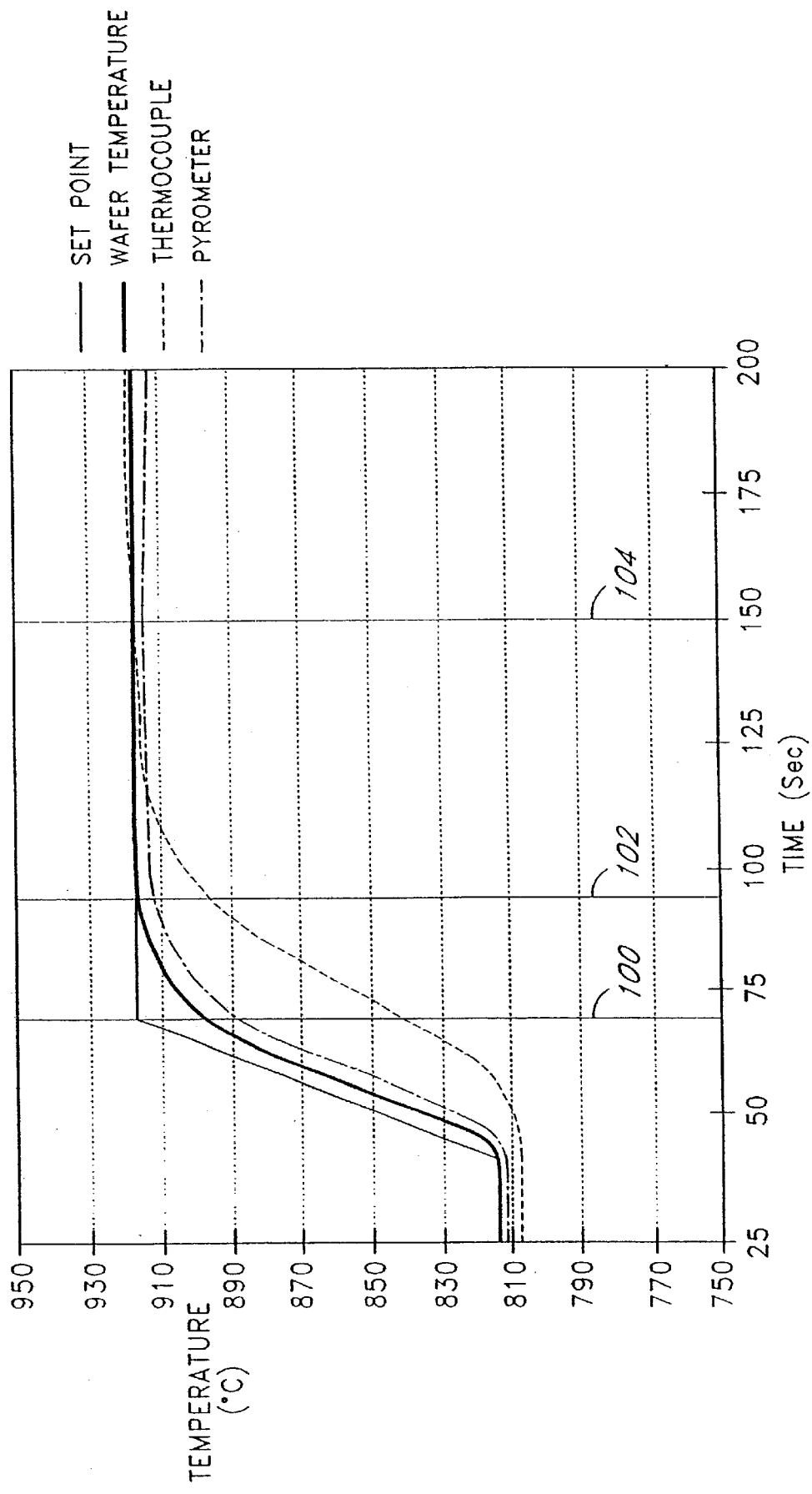
FIG. 5 is a graph of a temperature ramp conducted in accordance with a preferred method, plotting temperature on the abscissa and time on the ordinate axis.

FIG. 5 illustrates the temperature of the wafer 16, thermocouple 28, pyrometer 21, and the setpoint during a ramp portion of a recipe when a pyrometer is used as the temperature sensor of the controller 80. The temperature of the thermocouple 28 lags behind the temperature of both the wafer 16 and the pyrometer 21. At about 50 seconds, the temperature controller 80 initiates the ramping of the reactor temperature according to the setpoint. The thermocouple temperature only starts rising at about 60 seconds. The thermocouple temperature does not change as rapidly as the setpoint or the wafer temperature. When the wafer 16 reaches the treatment temperature at time (102) the thermocouple 28 is at a temperature almost twenty degrees lower. The pyrometer 21, on the other hand, is almost at the setpoint at time (102). FIG. 5 assumes that the pyrometer reading has been previously adjusted by the controller 80 such that when the pyrometer reading is close to the setpoint, the controller 80 adjusted reading is equal to the setpoint. Therefore, the temperature controller 80 controls the heating elements 13, 14, and 15 to reduce the heat provided to the wafer and follow the setpoint when the pyrometer reading is at the level of time (102).

During the steady state portion of the recipe, starting at time (100), the thermocouple temperature can catch up to the wafer temperature. The thermocouple temperature is a very reliable indicator of wafer temperature as of time (104). A thermocouple temperature as of time (104) is a more reliable indicator of wafer temperature than that of the pyrometer. Therefore, the temperature of the thermocouple at time (104) is used to calibrate the pyrometer readings to the temperature controller, as discussed with reference to FIG. 4.

As may be further appreciated from FIG. 5, the pyrometer temperature serves as a better indicator of wafer temperature during ramping than the thermocouple temperature because of the smaller lag. When the wafer 16 is at a steady state temperature, the thermocouple temperature may sometimes be a better indicator of wafer temperature than the pyrometer reading because the thermocouple 28 does not suffer from either drift or emissivity effects. Therefore, the temperature controller 80 can be set so as to employ the pyrometer 21 as the sensor during ramping and employ the thermocouple 28 as the sensor during a steady state portion of the recipe. In this manner, the better indicator of wafer temperature is employed at all portions of a recipe. Other combinations of employing both a pyrometer and a thermocouple as the sensors of the temperature controller may be employed without deviating from the spirit of the present invention.

In an alternative embodiment, several pyrometers are used as the sensors of the temperature controller. The pyrometers may be arranged around the wafer to provide information as to the distribution of temperature within the reactor. Each pyrometer may be associated with a thermocouple that is near the wafer portion that is instrumented by the pyrometer. Thus, the thermocouple temperature of the thermocouple that is associated with each pyrometer is used to adjust each pyrometer for drift.

Although the invention has been described in terms of certain preferred embodiments, other embodiments that are apparent to those of ordinary skill in the art, including embodiments which do not provide all of the features and advantages set forth herein, are also within the scope of this invention. Accordingly, the scope of the invention is intended to be defined by the claims that follow.

I claim:

1. A method of processing a substrate by a processing operation in a semiconductor processing chamber, comprising:
   supporting the substrate on a holder within the chamber;
   controlling a temperature within the processing chamber by using at least one temperature controller that is generally responsive to a non-contact-type temperature sensor;
   comparing a temperature measurement sensed by a contact-type sensor to a temperature measurement simultaneously sensed by a non-contact-type during the processing operation; and
   calibrating the non-contact-type sensor based on the comparison.

2. The method of claim 1, wherein controlling comprises controlling with a PID controller.

3. The method of claim 1, wherein the non-contact-type sensor comprises a pyrometer.

4. The method of claim 1, wherein the contact-type sensor comprises a thermocouple.

5. The method of claim 1, wherein controlling responds to the non-contact-type sensor during ramping and responds to the contact-type sensor during a setpoint plateau.

6. The method of claim 1, wherein controlling responds to the non-contact-type sensor during ramping and during a setpoint plateau.

7. The method of claim 1, wherein comparing comprises sensing with a plurality of non-contact-type sensors.

8. The method of claim 7, further comprising comparing each non-contact-type sensor with a corresponding contact-type sensor sensing temperature measurements at approximately the same location on the substrate.

9. The method of claim 8, wherein each pair, comprising a non-contact-type sensor and a contact-type sensor, is controlled with an independent temperature controller.

10. The method of claim 1, wherein calibrating is performed after the processing operation.

11. The method of claim 1, wherein the processing operation comprises a chemical vapor deposition.

12. The method of claim 1, wherein calibrating comprises adjusting the response of the temperature controller to the non-contact-type sensor based on the comparison.

13. A method of treating a substrate at elevated temperatures in a processing chamber, comprising:
    placing a wafer in the processing chamber;
    ramping the temperature of the substrate with a temperature controller that is responsive to temperature measurements from an optical pyrometer; and
    calibrating the optical pyrometer by reference to a temperature measurement from a thermocouple that is taken while treating the wafer.

14. The method of claim 13, wherein treating the wafer comprises epitaxial deposition and the wafer temperature varies within about 4° C. of a target temperature.

15. The method of claim 13, wherein treating the wafer comprises polysilicon deposition and the wafer temperature varies within about 1° C. of a target temperature.

16. The method of claim 13, wherein treating the wafer comprises dopant activation and the wafer temperature varies within about 50° C. of a target temperature.

17. The method of claim 13, wherein the temperature controller is responsive to temperature measurements from the optical pyrometer while treating the wafer.

18. The method of claim 17, wherein treating the wafer is conducted at a setpoint plateau.

19. A semiconductor processing apparatus, comprising:
    a processing chamber;
    a substrate support within the chamber;
    at least one heating element arranged to heat the substrate within the chamber;
    an optical pyrometer arranged to measure a temperature at a point within the chamber;
    a thermocouple arranged to measure a temperature at about the point within the chamber; and
    a temperature controller associated with said heating element and said optical pyrometer for controlling the temperature of the substrate and associated with said thermocouple for calibrating the optical pyrometer.

20. The apparatus of claim 19, wherein the processing chamber comprises a chamber configured for chemical vapor deposition.

21. A method of controlling temperature in a semiconductor processing chamber, comprising:
    measuring a signal indicative of the temperature of an object within the chamber at a setpoint treatment temperature using a contact-type sensor while treating a substrate;
    measuring a signal indicative of the temperature of the object by using a non-contact-type sensor at the setpoint treatment temperature while treating the substrate;
    comparing the measurement from the contact-type sensor to the measurement from the non-contact-type sensor;
    calibrating the non-contact-type sensor based on the comparison; and
    controlling heating elements with the temperature controller in response to readings from the non-contact-type sensor.

22. The method of claim 21, wherein calibrating is performed after removal of the substrate from the processing chamber.

23. The method of claim 22, wherein controlling in response to readings from the non-contact-type sensor includes controlling during temperature ramping and while treating the wafer.

24. The method of claim 22, wherein controlling in response to reading from the non-contact-type sensor is conducted during temperature ramping, further comprising controlling the heating elements with the temperature controller in response to readings from the contact-type sensor.

25. A method of treating a plurality of workpieces in a series of temperature cycles, at least one temperature cycle comprising:
    loading at least one substrate into a processing chamber;
    controlling a temperature of the substrate with a temperature controller, the temperature controller responsive to a first temperature sensor at least during at least one stage of the temperature cycle;
    calibrating the first temperature sensor by comparing signals from the first temperature sensor to signals from a second temperature sensor taken simultaneously; and
    treating the workpiece at an elevated temperature; and
    unloading the substrate from the processing chamber.

26. The method of claim 25, wherein the first stage comprises temperature ramping and the signals that are compared for the calibrating are taken an elevated treatment temperature.

27. The method of claim 26, wherein the signals that are compared for the calibrating are taken a temperature setpoint plateau.

28. The method of claim 26, wherein the temperature controller is responsive to signals from the first temperature sensor throughout the cycle.

29. The method of claim 26, wherein the first temperature sensor comprises an optical pyrometer and the second temperature sensor comprises a thermocouple.

30. The method of claim 25, wherein treating the workpiece comprises conducting a chemical vapor deposition.

31. The method of claim 25, wherein the first temperature sensor comprises a plurality of non-contact-type temperature sensors and the second temperature sensor comprises a corresponding plurality of contact-type temperature sensors.

* * * * *